(12) United States Patent
Chang et al.

(10) Patent No.: US 8,390,365 B2
(45) Date of Patent: Mar. 5, 2013

(54) CHARGE PUMP SYSTEM FOR LOW-SUPPLY VOLTAGE

(75) Inventors: Meng-Fan Chang, Taichung (TW); Shin-Jang Shen, Zhubei (TW); Yi-Lun Lu, Kaohsiung (TW)

(73) Assignee: National Tsing Hua University, Hsin Chu (TW)

( * ) Notice: Subject to any disclaimer, the term of this patent is extended or adjusted under 35 U.S.C. 154(b) by 42 days.

(21) Appl. No.: 12/906,302

(22) Filed: Oct. 18, 2010

(65) Prior Publication Data

US 2012/0092063 A1    Apr. 19, 2012

(51) Int. Cl.
*H02M 3/00* (2006.01)
*G05F 3/08* (2006.01)

(52) U.S. Cl. .......................................... 327/536; 363/60
(58) Field of Classification Search ................. None
See application file for complete search history.

(56) References Cited

U.S. PATENT DOCUMENTS

| | | | | |
|---|---|---|---|---|
| 5,280,420 A | * | 1/1994 | Rapp | 363/60 |
| 6,160,723 A | * | 12/2000 | Liu | 363/60 |
| 6,483,728 B1 | * | 11/2002 | Johnson et al. | 363/60 |

* cited by examiner

*Primary Examiner* — Lincoln Donovan
*Assistant Examiner* — Terry L Englund
(74) *Attorney, Agent, or Firm* — Chih Feng YEH; Huntington IP Consulting Co., Ltd.

(57) ABSTRACT

A charge pump system for low-supply voltage includes: a clock generator to generate a plurality of clock signals; a clock pump circuit coupled to said clock generator to generate high voltage; a level shifter coupled to said clock generator and said clock pump circuit to generate a plurality of HV (high voltage) clock signals; a main pump circuit coupled to said clock generator and said level shifter to generate output voltage.

15 Claims, 9 Drawing Sheets

CHARGE PUMP SYSTEM FOR LOW-SUPPLY VOLTAGE

TECHNICAL FIELD

The present invention generally relates to a charge pump, and especially to a charge pump for low-supply voltage.

DESCRIPTION OF THE RELATED ART

An on-chip voltage generator or a multiplier is introduced in the IC with single power supply to generate voltage higher than supply voltage. Generally, the higher voltage is the desired voltage for maintaining the normal function of the IC, and the device which can implement aforementioned features is called a charge pump. A charge pump which can generate positive voltage higher than the supply voltage or negative voltage lower than the supply voltage may widely be used in the field of memory, such as the back bias of the DRAM, programming and erasing of the non-volatile memory (such as OTP (one time programmable read only memory), EEPROM, Flash memory, etc. Take programming of the stake gate of Flash memory as an example, positive high voltage may drive electrons from the control gate to the floating gate by CHE or FN (Flowler-Nordheim) method, which means the accomplishment of programming. The same theory may be used in erasing. When the control gate is input by negative high voltage and the source gate is input by a positive high voltage, the negative electrons will be drawn from the floating gate to the source gate, which means the accomplishment of erasing.

A charge pump is a DC/DC converter that consists of MOS switches and energy-transfer capacitors in pump stage. Capacitor charge pumps are commonly used for pumping charge upward to produce higher than the regular supply voltage or downward to negative voltage on a chip. This structure does not require magnetic components, so it becomes an important circuit technique in lower cost design. Output current of a charge pump can be described as the following:

$$Iout = C[(1+1/N)(VDD-Vth) - Vout/N]/T$$

The capacitor and the value of the VDD (supply voltage) minus Vth (threshold voltage) are proportional to output current according to aforementioned formula. Therefore, the key to design a charge pump is to increase the capacitor and the VDD (supply voltage), or decrease the Vth.

The charge pump widely used is the Dickson' CPC (charge pump circuit). The Dickson' CPC which is based on the Dickson diode connected NMOS structure uses the switched-capacitor circuit to transfer charges in a single way, but it may suffer from the Vth (threshold voltage) of NMOS such that the transferring charges will be reduced. As the voltage on HV (high voltage) path of each stage increases, the Vth increases since the HVNMOS may suffer from body effect. Hence, the voltage gain decreases as the number of stages increases, and then the output voltage may not linearly increase anymore.

The efficiency of Dickson's CPC is far from an ideal value because of the voltage drop per stage. To overcome the aforementioned problem of Dickson's CPC, NPC-1 (New charge pump) which utilizes the static CTSs (charge transfer switches) to solve the problem of the voltage drop from the source to the drain is introduced. And NPC-2 may improve the efficiency effectively by using body bias control to make the voltage of the body vary according to the higher one of the drain and the source. NPC-3 uses a high voltage clock generator configured in front of the last stage to provide high voltage at the last stage. Additionally, the four phase clock scheme is generally introduced to increase the ΔV (voltage gain) by exceeding the Vgate of $M_p$ (power transistor) more than HV path, therefore the gain degradation due to Vth can be alleviated.

In pace with the development of technology, low-supply voltage, low power consumption, high operation speed is a trend. Take the development of the process of CMOS as an example, the operation voltage turns from 3.3V to 1.8V, and the operation voltage is 1.0V in the current 90 mm process. Thus, lower and lower operation voltage may be expected in the future. Additionally, regenerated energy such as a solar cell becomes more important as a power source, however, the output voltage of the solar cell is 0.5V which is much lower than the operation voltage in recent process. Therefore, low-supply voltage is very important in the future. However, the charge pumps mentioned above cannot generally be operated at a low supply voltage because the voltage of which $V_{DD}$ (power supply voltage) minus Vth decreases, therefore, It's an urgent and important subject to develop a charge pump for low-supply voltage.

SUMMARY

The present invention generally relates to a charge pump, especially to a charge pump for low-supply voltage.

The dilemma described as followed will be faced during designing a charge pump for low-supply voltage, which includes: low-supply voltage, the Vth (threshold voltage) of HV (high voltage) devices which is relatively higher to low-supply voltage than to normal-supply voltage, the larger capacitor for increasing output current, and the body effect of transistors. To overcome the dilemma mentioned above, some solutions are introduced to the present invention such as: using HV clock signals to overcome the decreasing of VDD, using logic devices to replace HV devices because the Vth of logic devices is lower, using logic MOSCAP (MOS capacitor) to replace conventional capacitors because the area of MOSCAP is smaller, and boosting Vgate of transistors to overcome the body effect.

In an aspect of the present invention, a charge pump system for low-supply voltage is disclosed, which includes: a clock generator to generate a plurality of clock signals; a clock pump circuit coupled to said clock generator to generate high voltage; a level shifter coupled to said clock generator and said clock pump circuit to generate a plurality of HV clock signals; a main pump circuit coupled to said clock generator and said level shifter to generate output voltage.

In another aspect of the present invention, a method for operating a charge pump system is disclosed, which includes: generating a plurality of clock signals by a clock generator; transferring said plurality of clock signals to a clock pump circuit and a level shifter and a main pump circuit respectively; providing HV for said level shifter by said clock pump circuit; generating a plurality of HV clock signals by integrating said plurality of clock signals and said HV in said level shifter; and transferring said plurality of HV clock signals to said main pump circuit.

The structure and method will be understood according to the following description of the preferred embodiment and the drawings.

DETAILED DESCRIPTION

The present invention generally relates to a charge pump, and especially to a charge pump for low-supply voltage which can be introduced to an embedded nonvolatile memory.

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Figure 1:
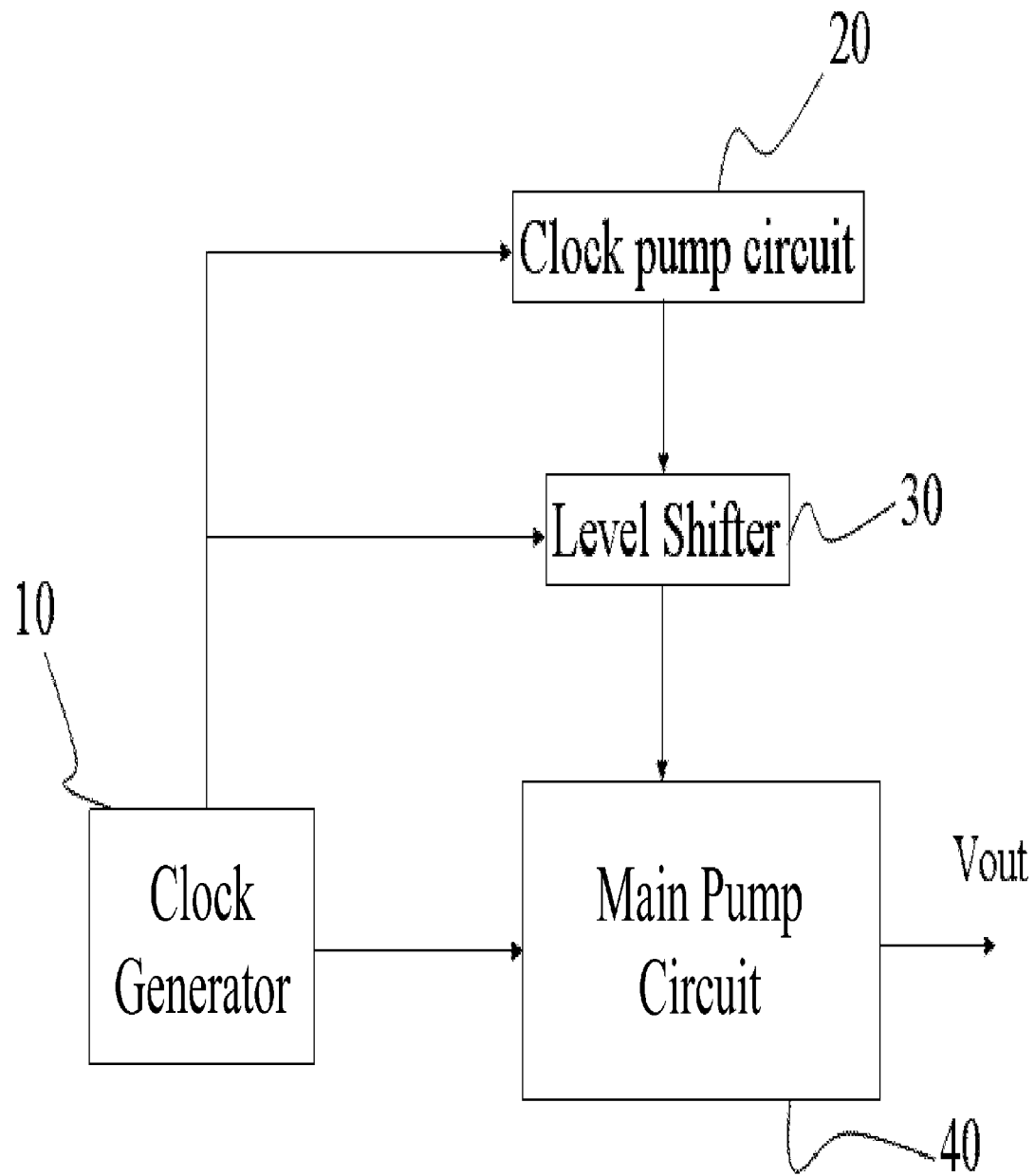
FIG. 1 shows an embodiment of the charge pump system of the present invention.

In a preferred embodiment of the present invention, referred to FIG. 1, a charge pump system for low-supply voltage includes a clock generator 10 to generate a plurality of clock signals which are four phase clock signals, a clock pump circuit 20 coupled to the clock generator 10 to generate HV (high voltage), a level shifter 30 coupled to the clock generator 10 and the clock pump circuit 20 to generate a plurality of HV clock signals, and a main pump circuit 40 coupled to the clock generator 10 and the level shifter 30 to generate output voltage.

Figure 2:
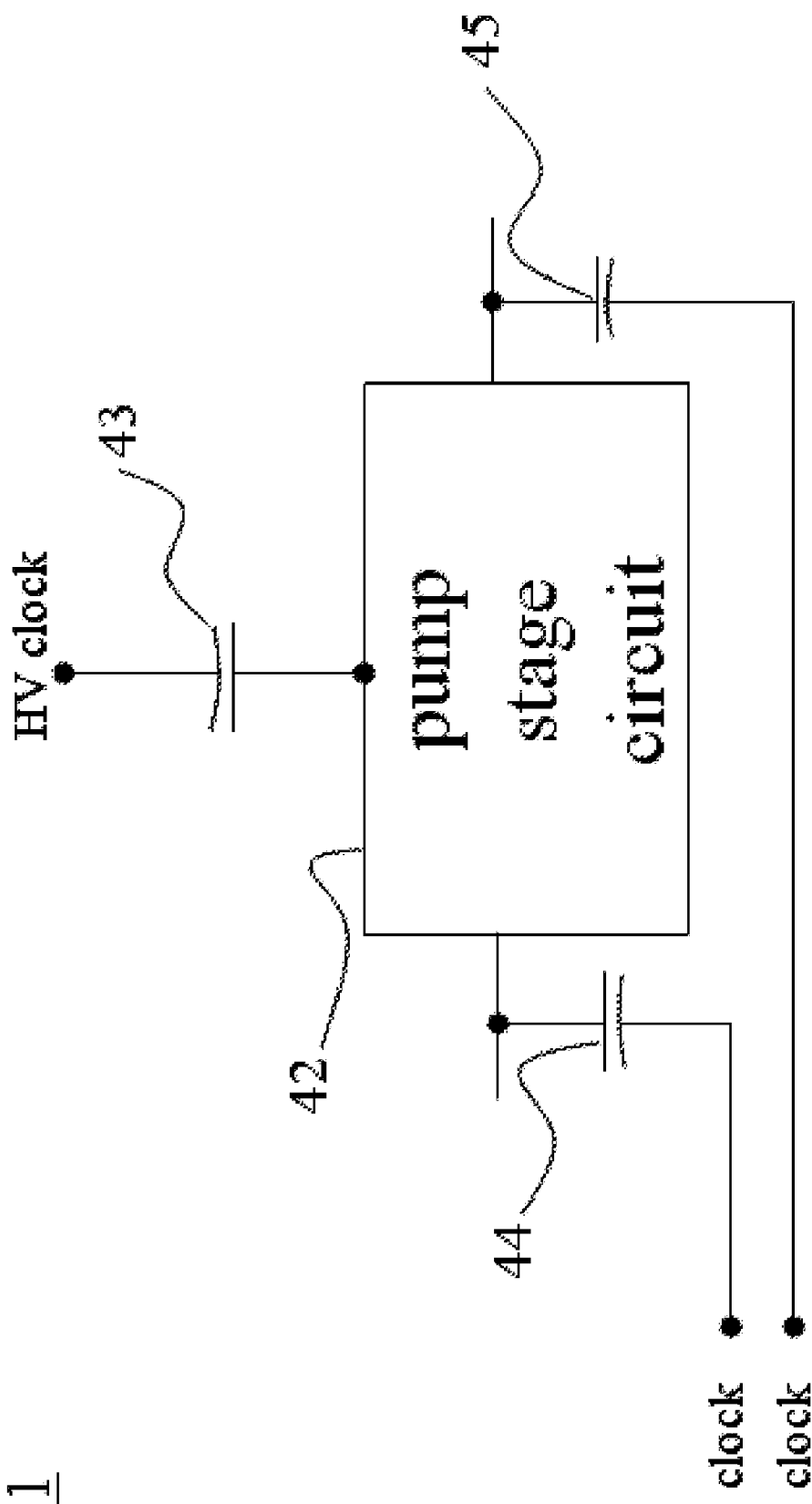
FIG. 2 shows an embodiment of the single structure of the present invention.

In an embodiment as shown in FIG. 2, the main pump circuit 40 comprises a plurality of single structures 41, wherein the single structure 41 includes a gate-boost capacitor 43 coupled to the level shifter 30 to receive the HV clock signal for increasing ΔV (voltage gain) which is not high enough to pump effectively because of low-power supply, in the illustration, a pump capacitor 44 and a pump capacitor 45 are coupled to the clock generator 10 to receive the clock signals respectively for pumping voltage to next stage, and a pump stage circuit 42 is respectively coupled with the capacitors 44, 45 and capacitor 43 which is connected to the HV clock. In the embodiment, the HV clock signal will be transferred through the gate-boost capacitor 43 to turn the pump stage circuit 42, and the clock signals will be transferred through the pump capacitor 44 and the pump capacitor 45 to pump voltage to next stage. By using the clock signals to pump voltage to next stage, the single structure 41 may save more power with less output voltage.

Figure 3:
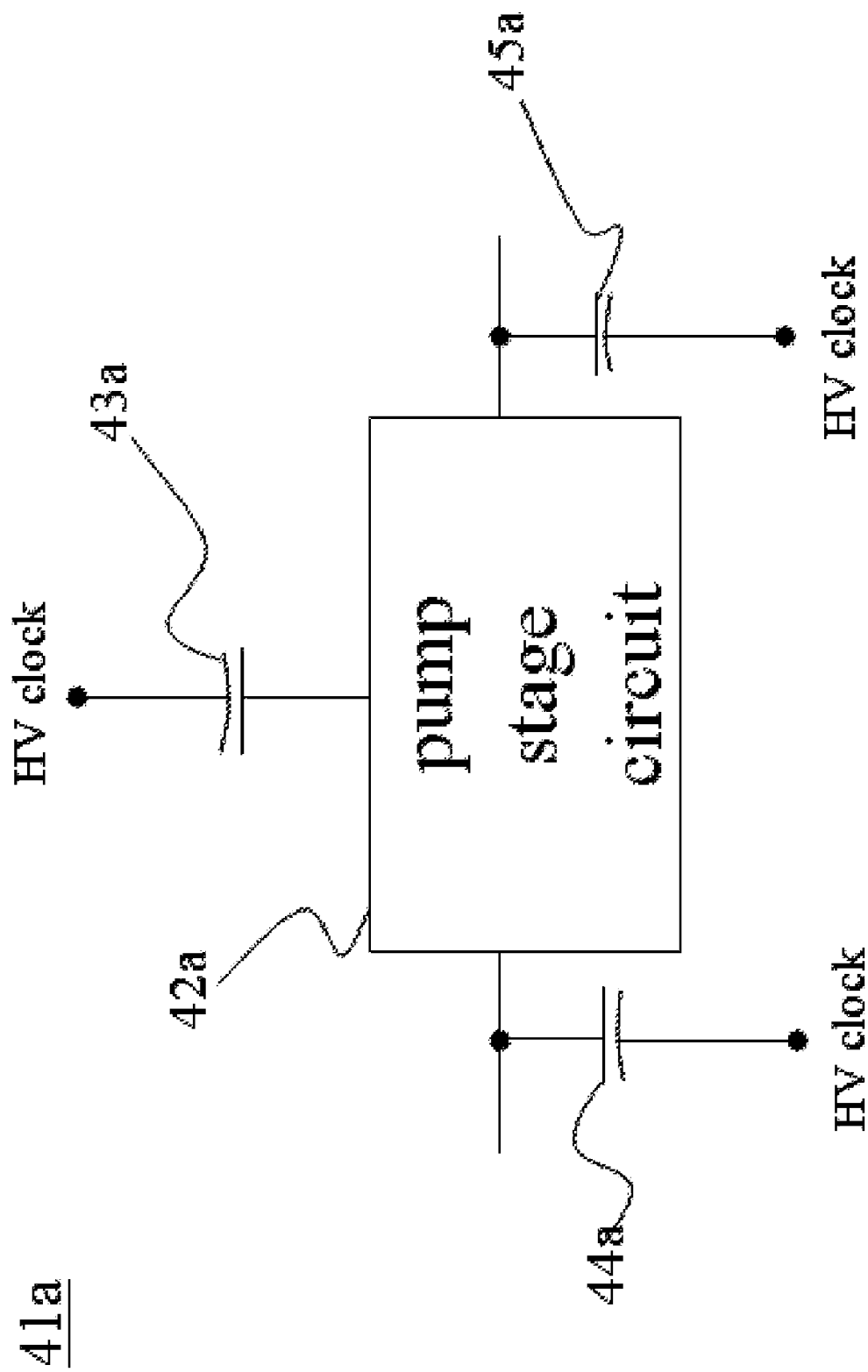
FIG. 3 shows an embodiment of the dual structure of the present invention.

In another embodiment as shown in FIG. 3, the main pump circuit 40 comprises a plurality of dual structures 41a, wherein the dual structure 41a includes a gate-boost capacitor 43a, a pump capacitor 44a and a pump capacitor 45a coupled to the level shifter 30 respectively to receive the HV clock signals for increasing ΔV which is not high enough to pump effectively because of low-power supply, and a pump stage circuit 42a. In the embodiment, the HV clock signal will be transferred through the gate-boost capacitor 43a to turn on the pump stage circuit 42a. Furthermore, the HV clock signals will either be transferred through the pump capacitor 44a and the pump capacitor 45a to pump voltage to next stage such that the output voltage of the dual structure 41a will be increased much more than the output voltage of the single structure 41. By applying HV clock signals to the gate-boost capacitor 43a, the pump capacitor 44a, and the pump capacitor 45a, the output voltage will be higher and the pumping ability will be improved, thereby being better than the prior art. However, the power of which the dual structure 41a will consume more energy.

Figure 4:
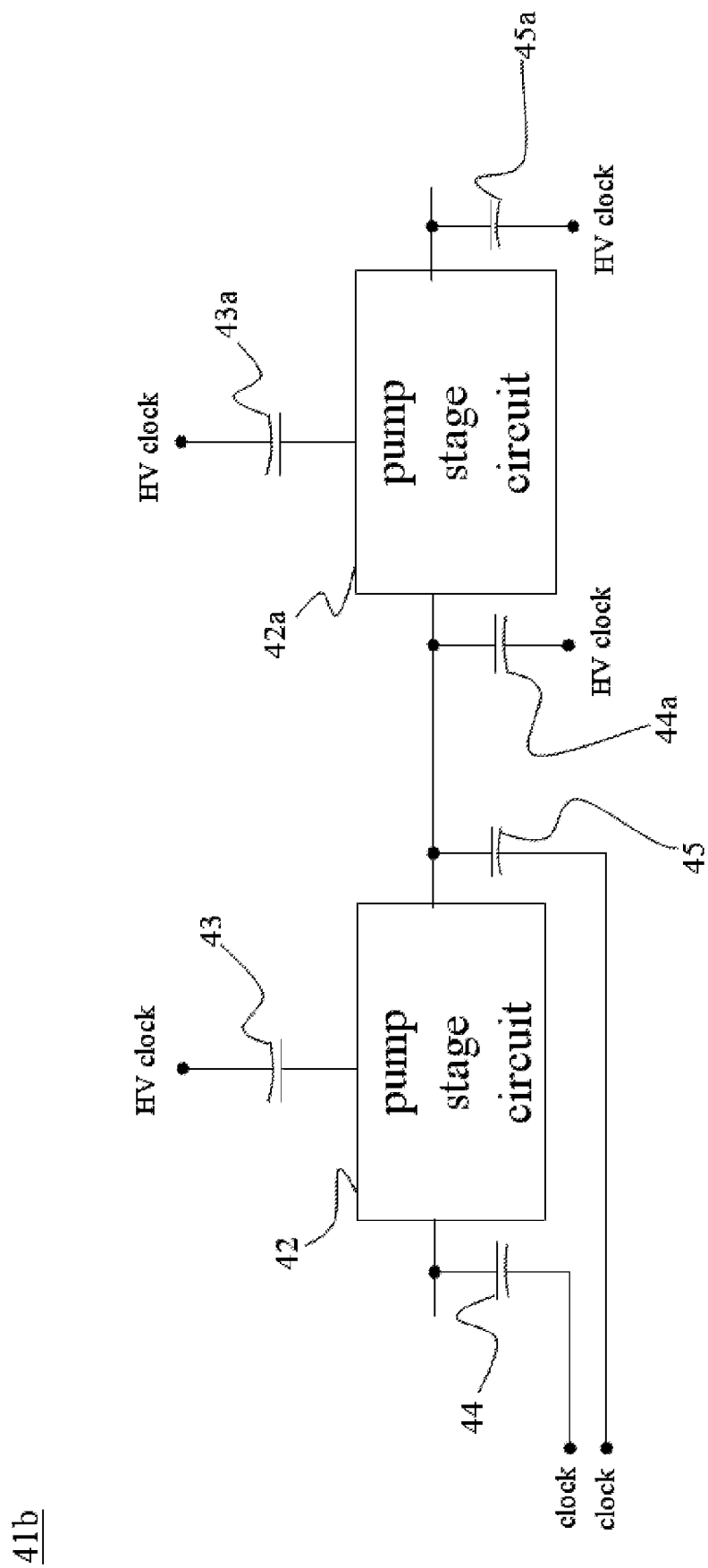
FIG. 4 shows an embodiment of the hybrid structure of the present invention.

In another preferred embodiment, a hybrid structure is disclosed to integrate the single structure 41 and the dual structure 41a to achieve the purpose of providing higher output voltage and saving more energy. As shown in FIG. 4, an embodiment of the present invention discloses a main pump circuit 40 (FIG. 1) which comprises a plurality of hybrid structures 41b, one is disclosed for illustration. The hybrid structure 41b includes two pump capacitors of a previous pump stage circuit 42 which includes the pump capacitor 44 and the pump capacitor 45 coupled to the clock generator 10 respectively to receive the clock signals and the gate-boost capacitor 43 of a previous pump stage circuit 42 coupled to the level shifter 30 to receive the HV clock signal. Two pump capacitors of a next pump stage circuit 42a including the pump capacitor 44a and the pump capacitor 45a are coupled to the level shifter 30 respectively to receive the HV clock signals. Subsequently, the gate-boost capacitor 43a of a next pump stage circuit 42a is coupled to the level shifter 30 to receive the HV clock signal. In the embodiment, the output voltage and the power supply are balanced and optimized by using the single structure 41 as the previous pump stage of the hybrid structure 41b and the dual structure 41a acts as the next pump stage of the hybrid structure 41b.

The area of capacitors such as MOSCAP can be reduced and the driving ability of the main pump circuit 40 can be improved by replacing HV devices with logic devices such as the logic MOSCAP which are introduced in the pump stage circuits with lower voltage, for instance, the previous stages of the main pump circuit 40, because logic devices can only be operated at low voltage such as 1V. A preferred embodiment of the main pump circuit 40 includes two stages of the single structure 41 with logic devices, seven stages of the single structure 41 with HV devices, three stages of the dual structure 41a with HV devices, and one output stage of dual structure with HV devices. Furthermore, logic devices can either be introduced in the clock generator 10, the clock pump circuit 20, and the level shifter 30 because the operating voltage of which are mentioned above is not more than 1V. Thus, the area of the charge pump may be reduced effectively and the driving ability of the level shifter 30 may be improved effectively.

Figure 5:
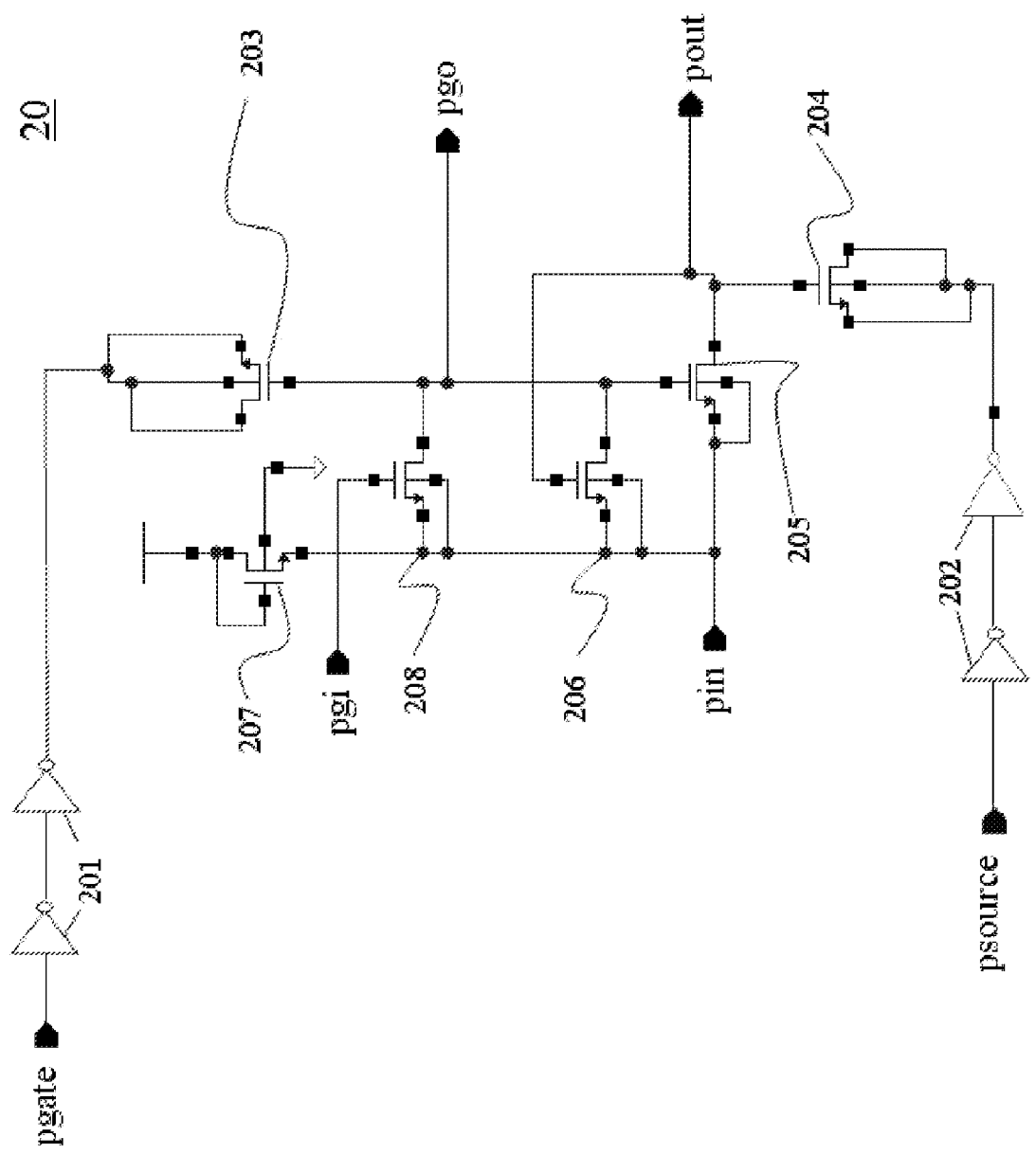
FIG. 5 shows an embodiment of the clock pump circuit of the present invention.

An embodiment of one stage of the clock pump circuit 20 is shown in FIG. 5. Two inverters 201 in the embodiment are coupled to the clock generator 10 (shown in FIG. 1) in serial and output pgate which is a clock signal to a gate NMOS 203 used as a gate capacitor by coupling the gate and the source and the drain together, and the gate of the gate NMOS 203 is coupled to the gate of the main NMOS 205. When pgate is at a high level, the main NMOS 205 will be turned on, followed by the charge of the stage will be transferred to the next stage. Two inverters 202 are coupled to the clock generator 10 in serial and output psource which is a clock signal to a pump NMOS 204 used as a pump capacitor by coupling the gate and the source and the drain together, and the gate of the pump NMOS 204 is coupled to the gate of a pass NMOS 206 so as to prevent reversed charge sharing. A clamp NMOS 207 of which the drain and gate is coupled to power supply is used as a voltage clamp to make the source voltage of the clamp NMOS 207 equal to VDD−Vth (power supply minus threshold voltage), and then the voltage of pin will be VDD−Vth if the initial value of pin is too low. Furthermore, when the pgate of the present stage is at a low level, the pgate of the previous stage will be at a high level, thus, the pgi of the present stage which equals the pgo of the previous stage is at a high level since the pgate of the previous stage is at a high level, and a secondary NMOS 208 which is controlled by the pgi may be turned on such that the main NMOS 205 can be turned off because the gate and the source of the main NMOS 205 is coupled, followed by reversed charge sharing is prevented.

Figure 6:
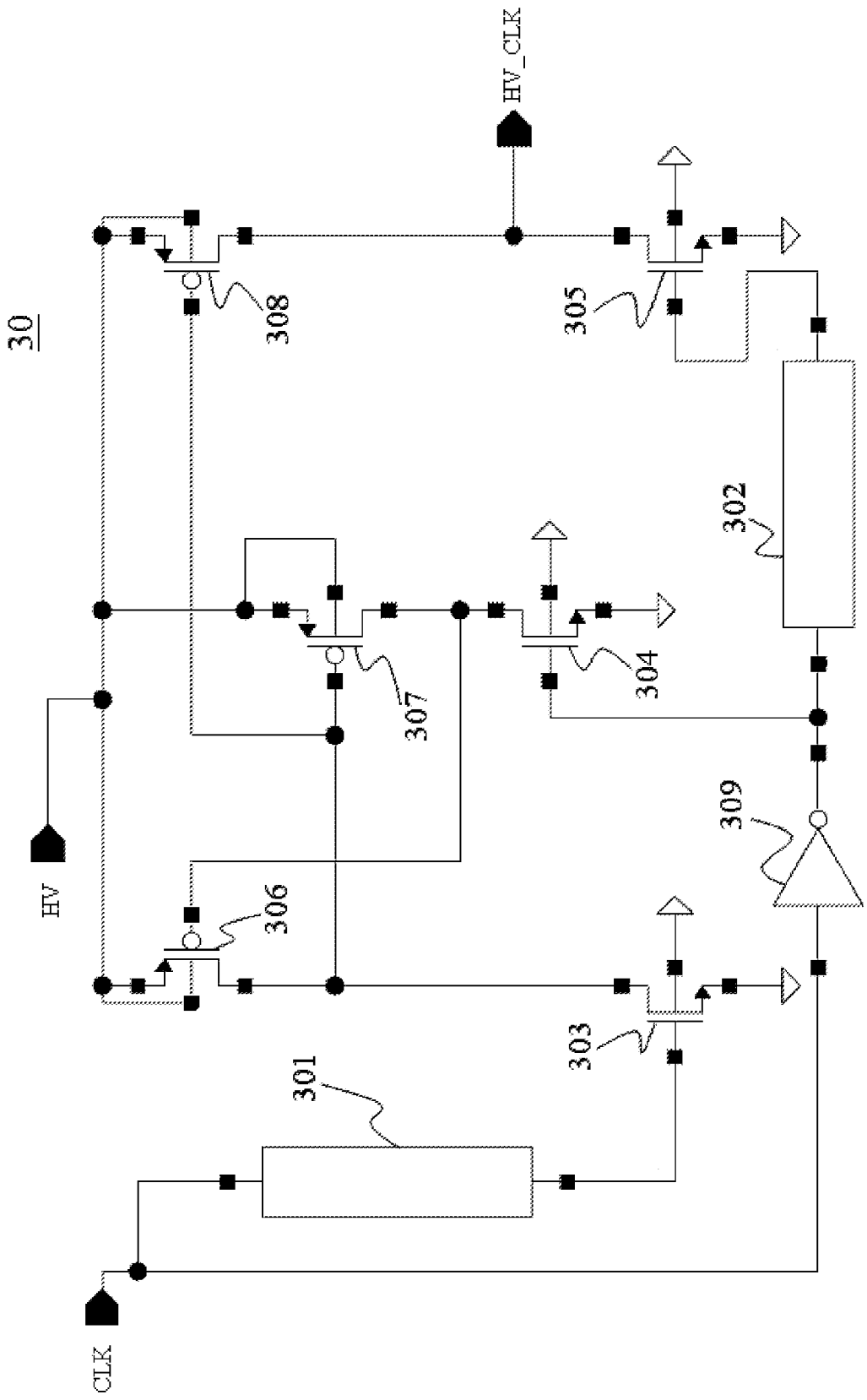
FIG. 6 shows an embodiment of the level shifter of the present invention.

An embodiment of the level shifter 30 of the present invention is shown in FIG. 6, which includes a first delay element 301, a second delay element 302, a NMOS 303, a NMOS 304, a NMOS 305, a PMOS 306, a PMOS 307, a PMOS 308, and an inverter 309, wherein the first delay element 301 and the inverter 309 are coupled to the clock generator 10 for receiving the clock signal in parallel, and the second delay element 302 and the gate of NMOS 304 are coupled to the inverter 309 in parallel, and the gate of the NMOS 305 is coupled to the delay element 302, and the NMOS 303 is coupled to the first delay element 301, and the source of the PMOS 306, the gate of the PMOS 307, and the gate of the PMOS 308 are coupled to the drain of the NMOS 303 in parallel, and the drain of the NMOS 304 and the gate of the PMOS 306 are coupled to the source of the PMOS 307 in parallel, and the drain of the PMOS 306, the drain of the PMOS 307 and the drain of the PMOS 308 are coupled to the clock pump circuit 20 for receiving HV in parallel, and the main pump circuit 40 is coupled to the drain of the NMOS 305 and the source of the PMOS 308 for transferring the HV clock signal. Therefore, the clock signal can be shifted to the HV clock signal through the NMOSs 303-305 and the PMOSs 306-308 such that the level shifter 30 can provide the main pump circuit 40 with HV clock signals.

Figure 7:
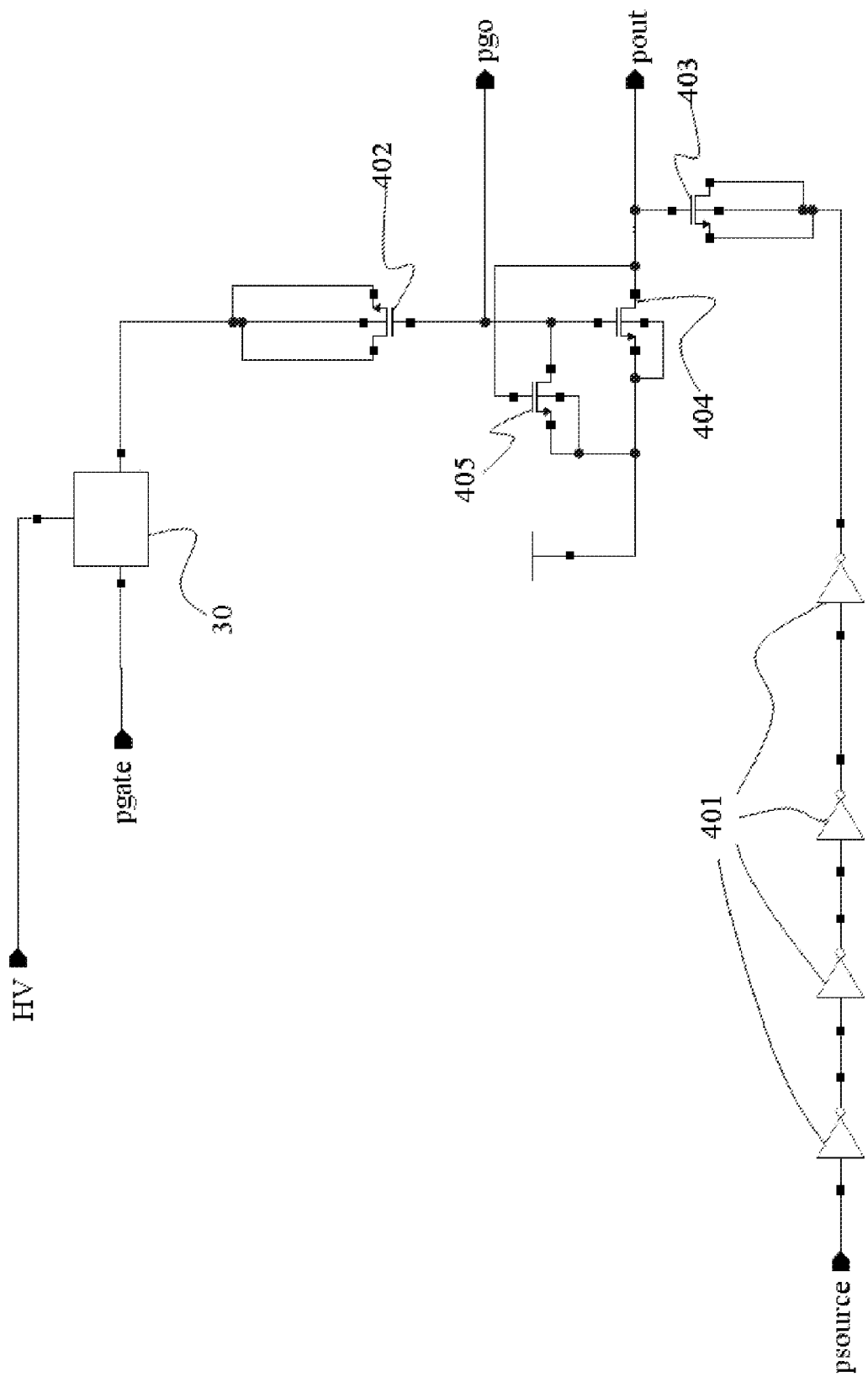
FIG. 7 shows an embodiment of the first stage of the main pump circuit of the present invention.

An embodiment of the first stage of the charge pump system of the present invention is shown in FIG. 7, which is a single structure with logic devices, including a level shifter 30, four inverters 401, a gate NMOS 402, a pump NMOS 403, a main NMOS 404, and a pass NMOS 405. In the embodiment, the level shifter 30 is coupled to the clock generator 10 to receive the pgate which is a clock signal and coupled to the clock pump circuit 20 to receive the HV (high voltage) and then generates a HV clock signal, and the gate NMOS 402 of which the gate and the source and the drain are coupled together as a gate capacitor is coupled to the level shifter 30 to receive the HV clock signal, and the main NMOS 404 is used to pump charges to the next stage, wherein the gate of the main NMOS 404 is coupled to the gate of the gate NMOS 402 such that the HV clock signal can control the main NMOS 404. Four inverters 401 which are coupled to the clock generator 10 in serial to receive the psource are coupled to the pump NMOS 403 for transferring the psource to the pump NMOS 403 which is used to be a pump capacitor by coupling the gate, source and drain of the pump NMOS 403 together. And the pass NMOS 405 is used to prevent reversed charge sharing by coupling the drain of the pass NMOS 405 to the gate of the main NMOS 404 and the source of the pass NMOS 405 to the source of the main NMOS 404 so as to turn off the main NMOS 404 when the psource is at a high level. In particular, the gate NMOS 402, the pump NMOS 403, the main NMOS 404, and the pass NMOS 405 are all logic NMOS because the voltage of the first stage is not more than 1V, followed by the driving ability can be improved and the area can be reduced.

Figure 8:
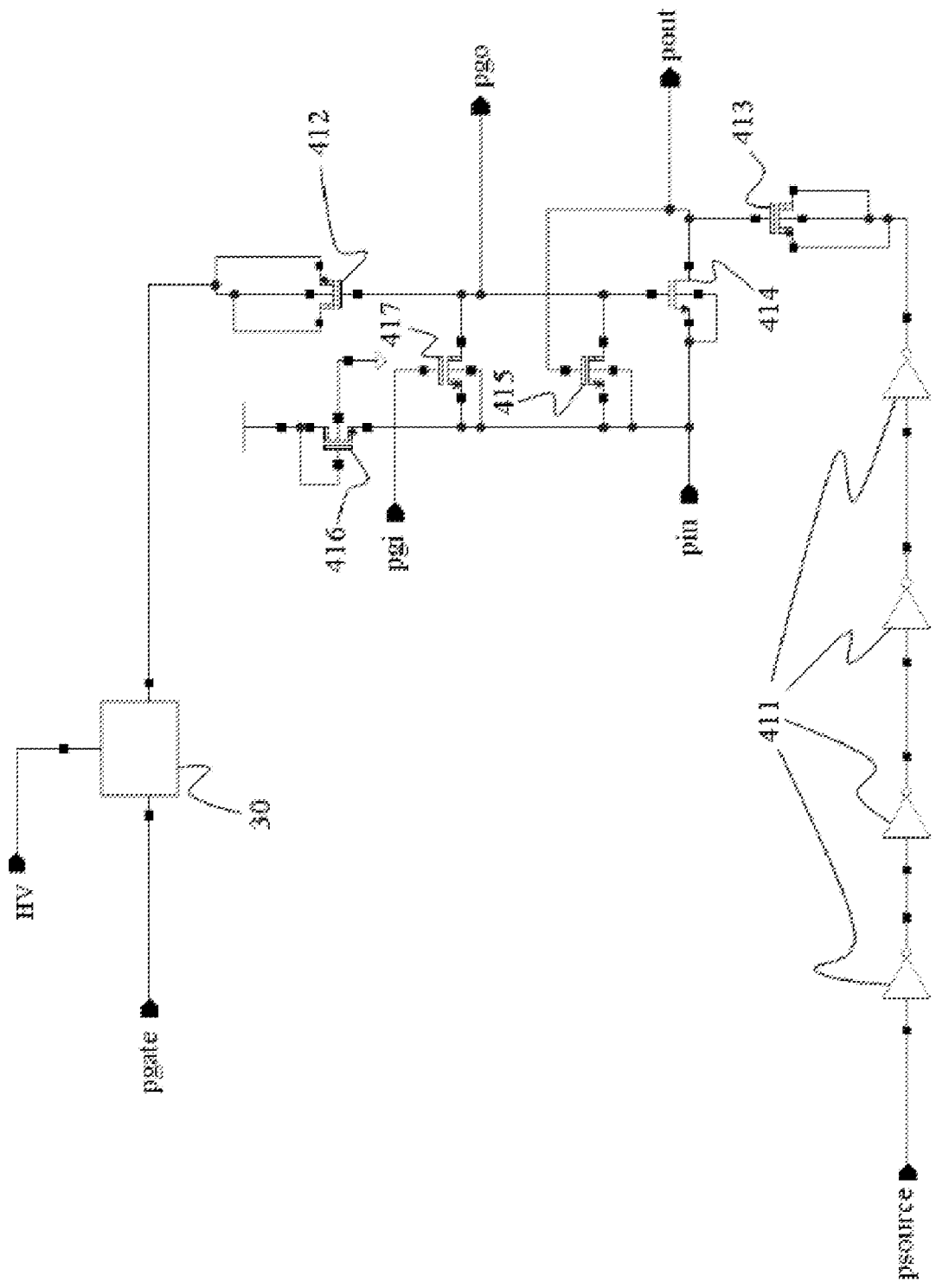
FIG. 8 shows an embodiment of the single structure of the present invention.

An embodiment of the single structure of the present invention is shown in FIG. 8, which includes a level shifter 30, four inverters 411, a gate NMOS 412, a pump NMOS 413, a main NMOS 414, a pass NMOS 415, a clamp NMOS 416, and a secondary NMOS 417. In the embodiment, the level shifter 30 is coupled to the clock generator 10 to receive the pgate which is a clock signal and coupled to the clock pump circuit 20 to receive the HV (high voltage) and thereby generating a HV clock signal, and the gate NMOS 412 of which the gate, the source and the drain are coupled together as a gate capacitor is coupled to the level shifter 30 to receive the HV clock signal, and the main NMOS 414 is used to pump charges to the next stage, wherein the gate of the main NMOS 414 is coupled to the gate of the gate NMOS 412 such that the HV clock signal can control the main NMOS 414. Four inverters 411 which are coupled to the clock generator 10 in serial to receive the psource are coupled to the pump NMOS 413 for transferring the psource to the pump NMOS 413 which is used to be a pump capacitor by coupling the gate, source and drain of the pump NMOS 413 together. And the pass NMOS 415 is used to prevent reversed charge sharing by coupling the drain of the pass NMOS 415 to the gate of the main NMOS 414 and the source of the pass NMOS 415 to the source of the main NMOS 414 so as to turn off the main NMOS 414 when the psource of the stage is at a high level. And the clamp NMOS 416 of which the drain and gate is coupled to power supply is used as a voltage clamp to make the source voltage of the clamp NMOS 416 equal to VDD−Vth (power supply minus threshold voltage), and then the voltage of pin will be VDD−Vth if the initial value of pin is too low. Furthermore, when the pgate of the present stage is at a low level, the pgate of the previous stage will be at a high level, thus, the pgi of the present stage which equals the pgo of the previous stage is at a high level since the pgate of the previous stage is at a high level, and a secondary NMOS 417 which is controlled by the pgi may be turned on such that the main NMOS 414 can be turned off because the gate and the source of the main NMOS 414 is coupled, followed by reversed charge sharing is prevented. In particular, the gate NMOS 412, the pump NMOS 413, the pass NMOS 415, the clamp NMOS 416, and the secondary NMOS 417 are all HV NMOS because the voltage of them may be higher than 1V, however, the main NMOS 414 can be a logic NMOS because the voltage is not higher than 1V.

Figure 9:
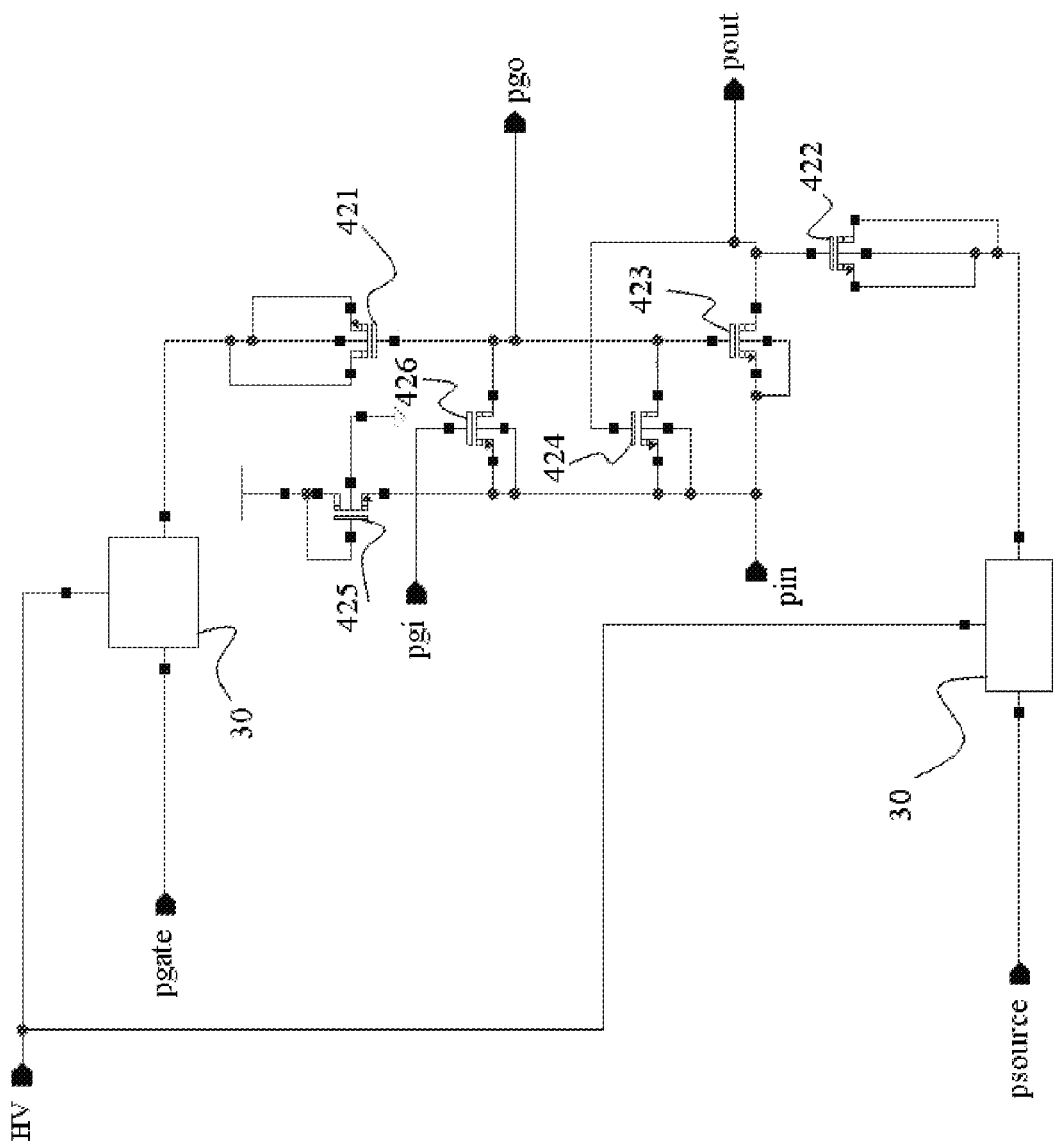
FIG. 9 shows an embodiment of the dual structure of the present invention.

An embodiment of the dual structure with HV devices of the present invention is shown in FIG. 9, which includes two level shifters 30, a gate NMOS 421, a pump NMOS 422, a main NMOS 423, a pass NMOS 424, a clamp NMOS 425, a secondary NMOS 426. In the embodiment, the level shifter 30 is coupled to the clock generator 10 to receive the pgate and psource which are clock signals with different phases and coupled to the clock pump circuit 20 to receive the HV (high voltage) and then generates a HV_pgate and a HV_psource which are HV clock signals respectively, and the gate NMOS 421 of which the gate and the source and the drain are coupled together as a gate capacitor is coupled to the level shifter 30 to receive the HV_pgate, and the main NMOS 423 is used to pump charges to the next stage, wherein the gate of the main NMOS 423 is coupled to the gate of the gate NMOS 421 such that the HV_pgate can control the main NMOS 423. And the pump NMOS 422 which is used to be a pump capacitor by coupling the gate, source and drain of the pump NMOS 422 together is coupled to the level shifter 30 to receive HV_psource. And the pass NMOS 424 is used to prevent reversed charge sharing by coupling the drain of the pass NMOS 424 to the gate of the main NMOS 423 and the source of the pass NMOS 424 to the source of the main NMOS 423 so as to turn off the main NMOS 423 when the HV_psource of the stage is at a high level. And the clamp NMOS 425 of which the drain and gate is coupled to power supply is used as a voltage clamp to make the source voltage of the clamp NMOS 425 equal to VDD−Vth (power supply minus threshold voltage), and then the voltage of pin will be VDD−Vth if the initial value of pin is too low. Furthermore, when the HV_pgate of the present stage is at a low level, the HV_pgate of the previous stage will be at a high level, thus, the pgi of the present stage which equals the pgo of the previous stage is at a high level since the HV_pgate of the previous stage is at a high level, and a secondary NMOS 426 which is controlled by the pgi may be turned on such that the main NMOS 423 can be turned off because the gate and the source of the main NMOS 423 is coupled, followed by reversed charge sharing is prevented. In particular, the gate NMOS 421, the pump NMOS 422, the main NMOS 423, the pass NMOS 424, the clamp NMOS 425, and the secondary NMOS 426 are all HV NMOS because the voltage of them may be higher than 1V.

One advantage of the present invention is that low supply voltage can be used in the charge pump because of the level shifter can shift the low supply voltage to high voltage, followed by the voltage gain of the charge pump can be improved.

One advantage of the present invention is that the clock generator, the clock pump circuit, the level shifter, and the main pump circuit can includes logic device which can reduce the area of the charge pump system and improve the driving ability.

One advantage of the present invention is that the main pump circuit uses a hybrid structure which can balance output voltage and power supply.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A charge pump system for low-supply voltage including:
    a clock generator to generate a plurality of clock signals;
    a clock pump circuit coupled to said clock generator to generate high voltage, wherein said high voltage is less than a highest operational voltage in a low threshold voltage device;
    a level shifter coupled to said clock generator and said clock pump circuit to generate a plurality of HV (high voltage) clock signals, wherein voltage of a high level of said HV clock signals is equal to said high voltage; and
    a main pump circuit coupled to said clock generator and said level shifter to generate an output voltage, wherein said main pump circuit comprises a plurality of single pump circuits, and each of said single pump circuits is a single structure, wherein said single structure includes two pump capacitors coupled to said clock generator for receiving said clock signals, a gate-boost capacitor coupled to said level shifter for receiving said HV clock signals, and a pump stage circuit.

2. The system according to claim 1, wherein said clock pump circuit comprises a plurality of low threshold voltage devices.

3. The system according to claim 1, wherein said level shifter comprises a plurality of low threshold voltage devices.

4. The system according to claim 1, wherein said pump stage circuit generates voltage less than 1V, and includes a plurality of low threshold voltage devices.

5. The system according to claim 1, wherein said pump stage circuit generates voltage greater than 1V, and includes a plurality of HV devices.

6. The system according to claim 1, wherein each of said pump capacitors and said gate-boost capacitor includes a plurality of low threshold voltage devices.

7. The system according to claim 1, wherein each of said pump capacitors and said gate-boost capacitor includes a plurality of HV devices.

8. A method for operating a charge pump system including:
    generating a plurality of clock signals by a clock generator;
    transferring said plurality of clock signals to a clock pump circuit and a level shifter and a main pump circuit respectively;
    providing high voltage for said level shifter by said clock pump circuit, wherein said high voltage is less than a highest operational voltage in a low threshold voltage device;
    generating a plurality of HV (high voltage) clock signals by integrating said plurality of clock signals and said HV in said level shifter, wherein voltage of a high level of said HV clock signals is equal to said high voltage;
    transferring said plurality of HV clock signals to said main pump circuit, wherein said main pump circuit comprises a plurality of single pump circuits, and each of said single pump circuits is a single structure;
    receiving said clock signals by two pump capacitors of said single structure;
    receiving said HV clock signals by a gate-boost capacitor of said single structure; and
    generating an output voltage by said main pump circuit.

9. A charge pump system for low-supply voltage including:
    a clock generator to generate a plurality of clock signals;
    a clock pump circuit coupled to said clock generator to generate high voltage, wherein said high voltage is less than a highest operational voltage in a low threshold voltage device;

a level shifter coupled to said clock generator and said clock pump circuit to generate a plurality of HV (high voltage) clock signals, wherein voltage of a high level of said HV clock signals is equal to said high voltage;

a main pump circuit coupled to said clock generator and said level shifter to generate an output voltage, wherein said main pump circuit comprises a plurality of single pump circuits, and each of said single pump circuits is a dual structure, wherein said dual structure includes two pump capacitors and a gate-boost capacitor coupled to said level shifter for receiving said HV clock signals respectively, and a pump stage circuit.

10. The system according to claim 9, wherein said clock pump circuit comprises a plurality of low threshold voltage devices.

11. The system according to claim 9, wherein said level shifter comprises a plurality of low threshold voltage devices.

12. The system according to claim 9, wherein each of said pump capacitors, said gate-boost capacitor, and said pump stage circuit includes a plurality of HV devices.

13. A charge pump system for low-supply voltage including:

a clock generator to generate a plurality of clock signals;

a clock pump circuit coupled to said clock generator to generate high voltage, wherein said high voltage is less than a highest operational voltage in a low threshold voltage device;

a level shifter coupled to said clock generator and said clock pump circuit to generate a plurality of HV (high voltage) clock signals, wherein voltage of a high level of said HV clock signals is equal to said high voltage;

a main pump circuit coupled to said clock generator and said level shifter to generate an output voltage, wherein said main pump circuit comprises a plurality of single pump circuits, and each of said single pump circuits is a hybrid structure, wherein said hybrid structure of each of said single pump circuits includes a first single pump stage circuit and a second single pump stage circuit, wherein said hybrid structure includes two pump capacitors of said first single pump stage circuit coupled to said clock generator for receiving said clock signals respectively and a gate-boost capacitor of said first single pump stage circuit coupled to said level shifter for receiving said HV clock signals, and two pump capacitors of said second single pump stage circuit and a gate-boost capacitor of said second single pump stage circuit coupled to said level shifter for receiving said HV clock signals respectively.

14. The system according to claim 13, wherein said clock pump circuit comprises a plurality of low threshold voltage devices.

15. The system according to claim 13, wherein said level shifter comprises a plurality of low threshold voltage devices.

\* \* \* \* \*